(12) United States Patent
Oh

(10) Patent No.: US 7,682,971 B2
(45) Date of Patent: Mar. 23, 2010

(54) SEMICONDUCTOR DEVICE AND METHOD FOR MANUFACTURING THE SAME

(75) Inventor: Yong ho Oh, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 176 days.

(21) Appl. No.: 11/893,010

(22) Filed: Aug. 13, 2007

(65) Prior Publication Data

US 2008/0111201 A1    May 15, 2008

(30) Foreign Application Priority Data

Nov. 13, 2006 (KR) .................. 10-2006-0111456

(51) Int. Cl.
*H01L 21/44* (2006.01)
(52) U.S. Cl. ............... 438/664; 257/E21.636
(58) Field of Classification Search .......... 438/230, 438/232, 663, 664, 655, 656; 257/E21.636, 257/E21.634
See application file for complete search history.

(56) References Cited

U.S. PATENT DOCUMENTS

| | | | | |
|---|---|---|---|---|
| 7,273,777 | B2 * | 9/2007 | Biery et al. | 438/230 |
| 2005/0037558 | A1 | 2/2005 | Gong et al. | |
| 2006/0205154 | A1 * | 9/2006 | Hung et al. | 438/257 |
| 2006/0286802 | A1 * | 12/2006 | Yu et al. | 438/682 |

* cited by examiner

*Primary Examiner*—David Vu
(74) *Attorney, Agent, or Firm*—The Law Offices of Andrew D. Fortney; Andrew D. Fortney

(57) ABSTRACT

Provided is a method for manufacturing a semiconductor device. In the method, a gate oxide layer, a gate polysilicon layer, and a capping oxide layer are sequentially formed on a semiconductor substrate. A photoresist pattern is formed on the capping oxide layer. The capping oxide layer, gate polysilicon layer, and gate oxide layer are sequentially etched using the photoresist pattern as an etch mask. Ions are then implanted into the semiconductor substrate using the photoresist pattern as a mask. A thermal diffusion process is performed to form source/drain regions. The capping oxide layer is removed, and ions are implanted into the gate polysilicon layer. After metal is deposited on the gate polysilicon layer, a silicide is formed.

19 Claims, 3 Drawing Sheets

SEMICONDUCTOR DEVICE AND METHOD FOR MANUFACTURING THE SAME

CROSS-REFERENCE TO RELATED APPLICATIONS

The present application claims priority under 35 U.S.C. 119 and 35 U.S.C. 365 to Korean Patent Application No. 10-2006-0111456 (filed on Nov. 13, 2006), which is hereby incorporated by reference in its entirety.

BACKGROUND

Most complementary metal oxide semiconductor (CMOS) devices form a poly gate using polysilicon. When the poly gate is formed of polysilicon, a depletion layer is indispensably formed more or less. In the case where an integration degree of a device is not so large, a poly gate may be relatively large. Accordingly, even when the depletion layer is generated, reduction in electrical characteristics of a device may be ignored.

However, recently, as integrating technology for semiconductor devices has remarkably developed, the size of a gate gradually reduces and accordingly a depletion layer generated at the gate has a relatively large influence, which acts as a factor reducing the performance of a semiconductor device. The above-described matter emerges as a limitation of a semiconductor device using polysilicon.

To overcome this limitation, various technologies have been tried, and a metal gate has been proposed as a basic solution. However, the metal gate may have a difficulty in a manufacturing process, and forming a dual gate imposes relatively high costs.

For an alternative, a process of forming a fully silicided gate (e.g., using full silicide, or FUSI), is proposed as a transition to full metal gates. Metal silicides are generally considered to be metal-like materials.

However, a FUSI gate also has a difficulty in a process that when metal is deposited and a thermal diffusion process is performed after ions have been implanted in the polysilicon, a defect can be generated because thermal expansion coefficients of the deposited metal and polysilicon are different.

SUMMARY

Embodiments of the invention provide a method for manufacturing a semiconductor device that solves a difficulty in a FUSI gate process due to differential thermal expansion during formation of a FUSI gate, and the semiconductor device manufactured by the method.

In one embodiment, a method for manufacturing a semiconductor device includes sequentially forming a gate oxide layer, a gate polysilicon layer, and a capping oxide layer on a semiconductor substrate; forming a photoresist pattern on the capping oxide layer; sequentially etching the capping oxide layer, the gate polysilicon layer, and the gate oxide layer using the photoresist pattern as an etch mask; forming spacers and implanting first ions into the semiconductor substrate using the photoresist pattern and the spacers as an ion implantation mask; performing a thermal diffusion process on the semiconductor substrate into which the ions have been implanted to form source/drain regions; removing the capping oxide layer and implanting ions into the gate polysilicon layer; and depositing metal on the gate polysilicon layer, then forming a metal silicide from the metal and the gate polysilicon layer.

The details of one or more embodiments are set forth in the accompanying drawings and the description below. Other features will be apparent from the description and drawings, and from the claims.

DETAILED DESCRIPTION OF THE EMBODIMENTS

Various embodiments of the invention will be described in detail with reference to the accompanying drawings.

FIGS. 1 to 5 are views illustrating a method for manufacturing a semiconductor device according to an embodiment of the invention.

Figure 1:
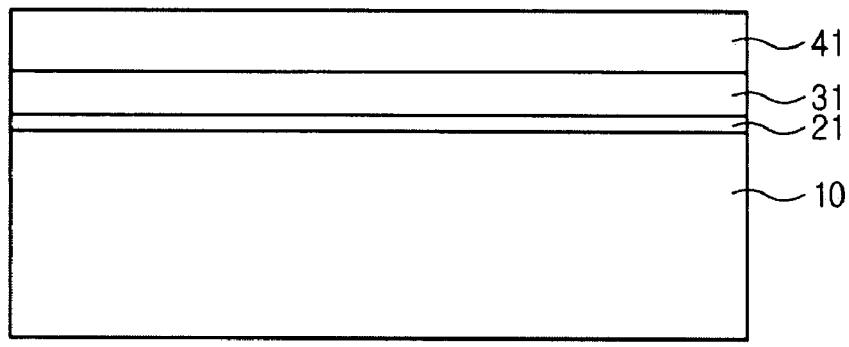
FIGS. 1 to 5 are views illustrating a method for manufacturing a semiconductor device according to an embodiment of the invention.

First, referring to FIG. 1, a gate oxide layer 21, a gate polysilicon layer 31, and a capping oxide layer 41 are sequentially formed on a semiconductor substrate 10. The capping oxide layer 41 is used as a dummy electrode or silicide blocking mask to separate silicidation of source/drain regions and silicidation of the polysilicon layer. When the thickness of the capping oxide layer 41 is thick, silicidation of the source/drain regions can be effectively separated from silicidation of the polysilicon layer. However, when the thickness of the capping oxide layer 41 is excessively thick, process costs may increase.

Therefore, the capping oxide layer 41 is advantageously one to three times thicker than that of the gate polysilicon layer 31. The gate polysilicon layer 31 may have a thickness of 30-60 nm, and the capping oxide layer 41 may have a thickness of 30-180 nm.

Figure 2:
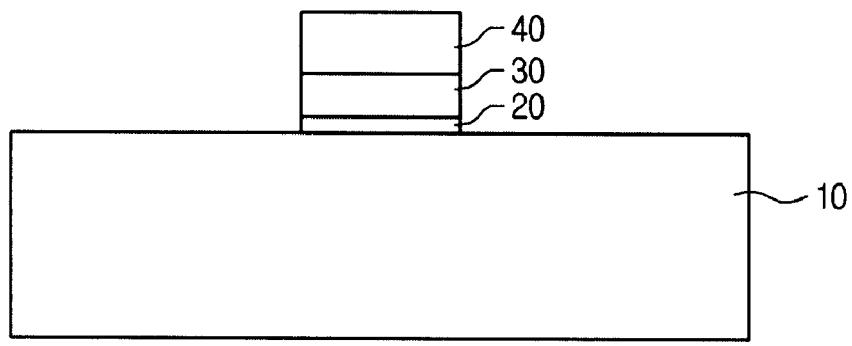

Next, referring to FIG. 2, a photoresist (not shown) is coated on the capping oxide layer 41. A pattern from a photolithography mask is reduction-projected onto the photoresist using an exposure apparatus such as a stepper, and the photoresist is exposed and developed to form the photoresist pattern (not shown). After that, the capping oxide layer 41, the gate polysilicon layer 31, and the gate oxide layer 21 are sequentially etched to form a capping oxide layer pattern 40, a gate polysilicon pattern 30, and a gate oxide layer pattern 20.

Figure 3:
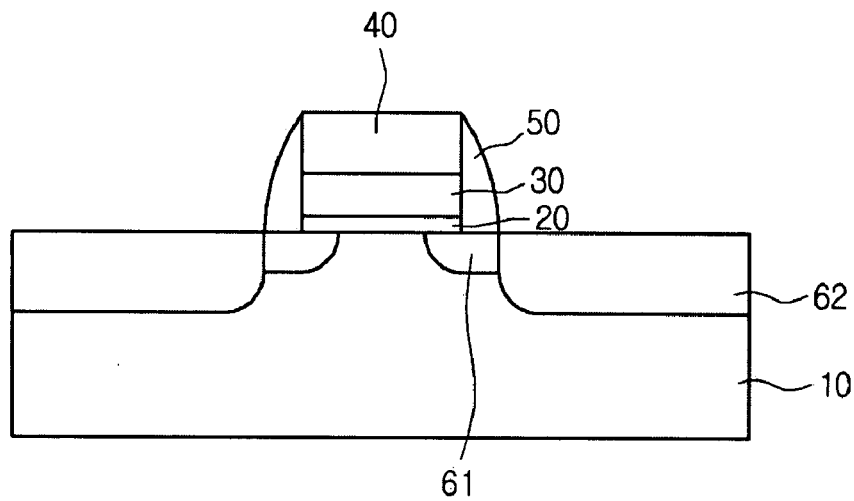

Next, referring to FIG. 3, ions are implanted through a known method using the capping oxide layer pattern 40 as a hard mask to form lightly doped drains (LDD) 61. Spacers 50 are formed on the lateral sides of the capping oxide layer 40, the gate polysilicon pattern 30, the gate oxide layer pattern 20, respectively, then source/drain regions 62 are formed by ion implantation, using the spacers 50 and the capping oxide layer 40 as a mask. The ions implanted to form source/drain regions 62 are generally the same type of dopant as for the LDDs 61, but they are implanted in a higher dose and at a higher energy than the LDDs 61.

Figure 4:
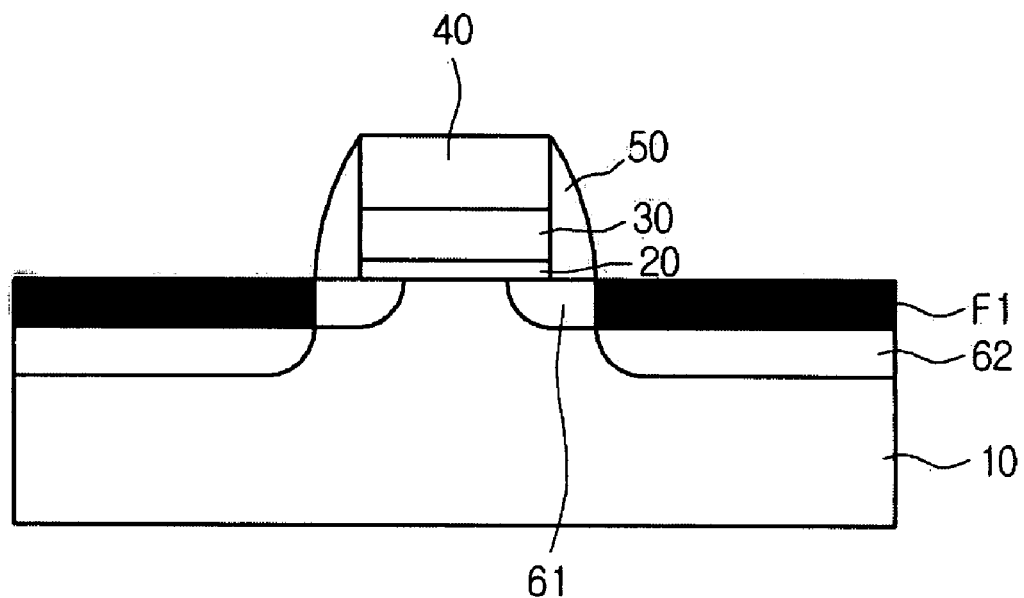

Next, referring to FIG. 4, after metal is deposited on the entire surface of the semiconductor substrate 10, a thermal process is performed to react the metal with the underlying silicon of the source/drain terminal and (in one embodiment) form a fully silicided (FUSI) source/drain F1, which comprises a metal like material. The deposited metal may comprise or consist essentially of W, Ti, Co, and/or Ni, some or all of which may further contain nitrogen (N). However, as shown in FIG. 4, it is not required that the entire thickness of the source/drain implant 62 be consumed by silicided source/drain F1. After the thermal silicidation reaction, unreacted metal is removed to form the structure shown in FIG. 4.

Figure 5:
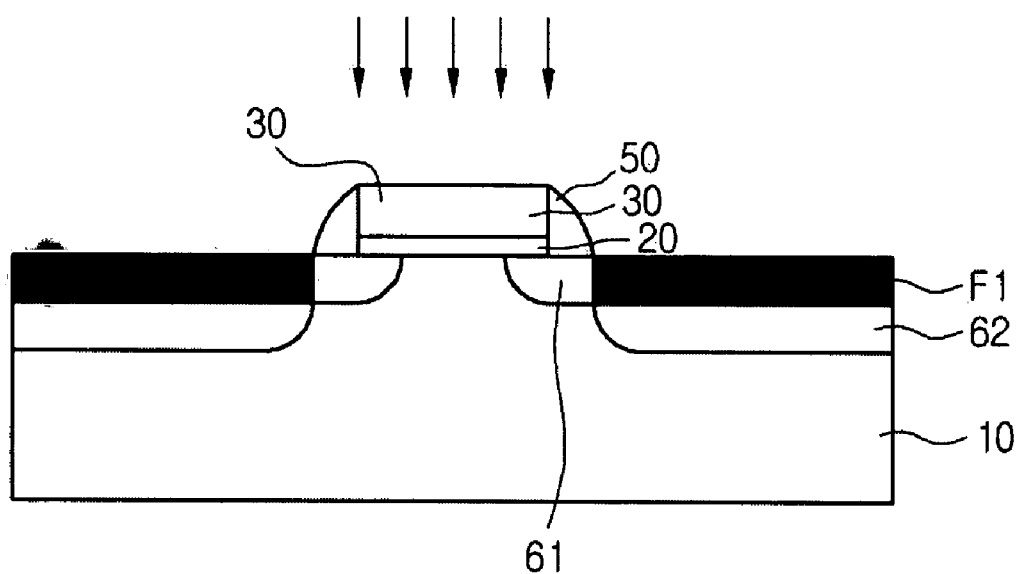

Next, referring to FIG. 5, the capping oxide layer pattern 40 and portions of the spacers 50 are removed, thereby exposing the uppermost surface of the patterned gate polysilicon 30, and then ions are implanted into the gate polysilicon pattern 30. Such ions may comprise N-type (e.g., P-, As- and/or Sb-containing) or P-type (e.g., B-containing) ions. In one embodiment, the type of ion (or the ion itself) that is implanted into the gate 30 matches the ion implanted into the source/drain terminals 62.

Figure 6:
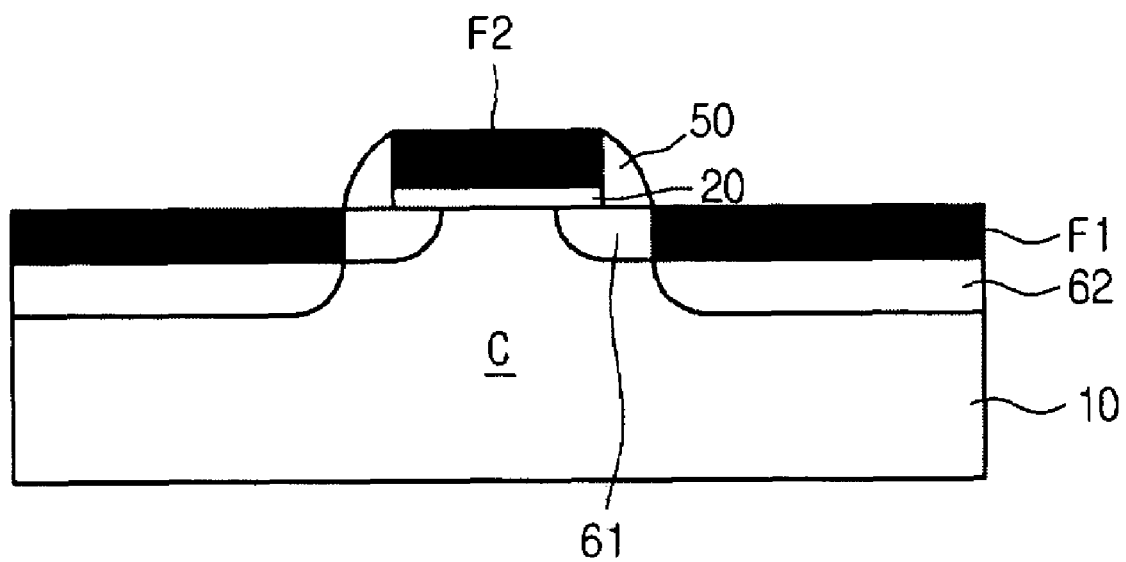
FIG. 6 is a cross-sectional view illustrating a semiconductor device according to an embodiment of the invention.

Next, referring to FIG. 6, after metal is deposited on the patterned gate polysilicon 30 into which the ions have been implanted, a thermal process is performed to allow a FUSI gate F2, which comprises a metal-like material, through chemical reaction between the Si of the gate polysilicon and the metal. The metal may comprise or consist essentially of W, Ti, Co, and Ni, independent of the metal that forms metal silicide F1. However, unlike the embodiment shown in FIG. 4, substantially the entire thickness of the gate polysilicon 30 is consumed in the silicidation reaction to form FUSI gate F2. After the thermal silicidation reaction, unreacted metal is removed to form the structure shown in FIG. 6.

In a method for manufacturing a semiconductor device according to an embodiment, after a gate oxide layer and a gate polysilicon layer are formed. Next, a capping oxide layer is formed and patterned (along with the gate oxide and gate polysilicon layers), and an ion implantation process and a spacer forming process are performed to enable separate silicidation of source/drain regions and the gate polysilicon pattern. After that, metal is deposited and a thermal process forms silicide on the source/drain regions. At this point, the gate polysilicon pattern, protected by the capping oxide layer, is not silicided.

After that, the capping oxide layer is removed, ions are implanted into the gate polysilicon pattern, metal is deposited, and a thermal process forms silicide from the gate polysilicon pattern and the metal deposited thereon. When the gate polysilicon pattern is relatively thin, the polysilicon pattern can be substantially completely silicided, so that a defective device generated due to a difference in a thermal expansion coefficient between the metal and the polysilicon remarkably reduces in comparison with the related art embodiment(s) described herein. Because the source/drain silicide (e.g., F1) has already been formed, in many cases (such as the "thin gate" embodiment described herein), subsequent deposition of further metal on the source/drain silicide F1 and thermal treatment thereof (e.g., to form the gate silicide F2) has little effect on the source/drain silicide F1 other than perhaps to the stoichiometry of the source/drain silicide F1.

Referring to FIG. 6, a semiconductor device manufactured using the above-described method according to an embodiment includes a semiconductor substrate 10 including source/drain regions 62, a channel C between the source/drain regions 62, a gate oxide layer 20 on the channel C, a first metal silicide gate F2 on the gate oxide layer and including a compound of metal and polysilicon, and spacers 50 formed on the lateral sides of the gate oxide layer 20 and the metal silicide gate F2. Here, the metal may comprise W, Ti, Co, and/or Ni. The gate 30 or gate silicide F2 has a thickness 20-30 times greater than that of the gate oxide layer 20. The gate 30 or gate silicide F2 may have a thickness of 30-60 nm in certain embodiments. As the capping oxide layer is removed, the gate of the present semiconductor device may have a silicidation thickness of 30-60 nm, which may indispensably or effectively result in a thickness reduced by about the thickness of the removed capping oxide layer.

According to the above-described semiconductor device and a manufacturing method thereof, a relatively thin polysilicon pattern thickness is silicided, so that a formation rate of defective devices resulting from a difference in thermal expansion coefficients between the metal and the polysilicon can be remarkably reduced, and accordingly, the electrical characteristics of the manufactured semiconductor devices can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, the method comprising:

sequentially forming a gate oxide layer, a gate polysilicon layer, and a capping oxide layer on a semiconductor substrate;

forming a photoresist pattern on the capping oxide layer;

sequentially etching the capping oxide layer, the gate polysilicon layer, and the gate oxide layer using the photoresist pattern as an etch mask;

implanting first ions into the semiconductor substrate using the photoresist pattern as an ion implantation mask;

forming spacers on lateral sides of the etched capping oxide layer, the etched gate polysilicon layer, and the etched gate oxide layer;

performing a thermal diffusion process on the semiconductor substrate into which the ions have been implanted to form source/drain regions;

removing the capping oxide layer and portions of the spacers to expose the gate polysilicon layer;

implanting second ions into the gate polysilicon layer; and depositing a first metal on the gate polysilicon layer, then forming a metal silicide from the metal and the gate polysilicon layer.

2. The method according to claim 1, wherein the capping oxide layer has a thickness of from one to three times greater than that of the gate polysilicon layer.

3. The method according to claim 1, wherein the gate polysilicon layer has a thickness of 30-60 nm, and the capping oxide layer has a thickness of 30-180 nm.

4. The method according to claim 1, wherein the metal comprises W, Ti, Co, or Ni.

5. The method according to claim 4, wherein the first metal further comprises N.

6. The method according to claim 1, wherein forming the metal silicide consumes substantially the entire gate polysilicon layer.

7. The method according to claim 1, wherein the metal silicide has a thickness 20-30 times greater than that of the gate oxide layer.

8. The method according to claim 1, wherein removing the capping oxide layer and portions of the spacers exposes the uppermost surface of the etched gate polysilicon layer.

9. The method according to claim 1, wherein implanting the first ions forms lightly doped drains (LDD).

10. The method according to claim 1, further comprising implanting third ions into the semiconductor substrate to form source and drain regions.

11. The method according to claim 10, wherein the spacers and capping oxide layer are used as a mask when implanting the third ions.

12. The method according to claim 10, wherein the second and third ions are implanted at a higher dose and higher energy than the first ions.

13. The method according to claim 10, further comprising, after forming the source and drain regions, forming silicided source and drain regions by depositing a second metal on an entire surface of the semiconductor substrate and performing a thermal process.

14. The method according to claim 13, wherein the silicided source and drain regions are formed prior to removing the capping oxide layer, and the capping oxide layer acts as a silicide blocking mask while forming the silicided source and drain regions.

15. The method according to claim 13, wherein the second metal comprises W, Ti, Co, or Ni.

16. The method according to claim 15, wherein the second metal further comprises N.

17. The method according to claim 13, wherein forming the silicided source and drain regions substantially completely consumes the source and drain regions.

18. The method according to claim 1, wherein the second implanted ions are of the same type as the first implanted ions.

19. The method according to claim 1, wherein forming the metal silicide comprises a thermal process.

* * * * *